(12) United States Patent
Lee et al.

(10) Patent No.: US 7,214,950 B2
(45) Date of Patent: May 8, 2007

(54) TRANSITION RADIATION APPARATUS

(75) Inventors: Sang H. Lee, Sunnyvale, CA (US); Yashesh A. Shroff, Santa Clara, CA (US); Christof G. Krautschik, Cupertino, CA (US)

(73) Assignee: Intel Corporation, Santa Clara, CA (US)

( * ) Notice: Subject to any disclaimer, the term of this patent is extended or adjusted under 35 U.S.C. 154(b) by 435 days.

(21) Appl. No.: 10/917,819

(22) Filed: Aug. 13, 2004

(65) Prior Publication Data

US 2006/0033053 A1 Feb. 16, 2006

(51) Int. Cl.
*A61N 5/00* (2006.01)
*G01J 3/10* (2006.01)

(52) U.S. Cl. .............................. 250/492.2; 250/504 R; 250/492.3; 250/372; 250/365; 315/111.81; 315/149; 315/150; 315/500; 315/503

(58) Field of Classification Search ...................... None
See application file for complete search history.

(56) References Cited

U.S. PATENT DOCUMENTS

2004/0183486 A1 9/2004 Goldstein

OTHER PUBLICATIONS

Shroff, Yashesh A., U.S. Appl. No. 10/915,809 entitled "Transition Radiation Apparatus and Method Therefor," filed Aug. 10, 2004, 37 pages including drawings.

Shroff, "Transition Radiation Apparatus and Method Therefor" U.S. Patent Application (serial number not yet assigned), filed Aug. 10, 2004.

Knulst et al., "Observation of narrow-band Su L-edge Cerenkov radiation generated by 5 MeV electrons", Applied Physics Letters, vol. 79, No. 18, pp. 2999-3001, Oct. 29, 2001.

Knulst et al., "High-brightness, narrowband and compact, soft x-ray Cherenkov sources in the water window", Applied Physics Letters, vol. 83, No. 19, pp. 4050-4052, Nov. 10, 2003.

Cherry et al., "The Efficient Identification of Relativistic Particles by Transition Radiation", Nuclear Instruments and Methods, vol. 115, pp. 141-150, 1974.

Yuan et al., "Energy Dependence of X-Ray Transition Radiation from Ultrarelativistic Charged Particles", Physics Letters, vol. 31B, No. 9, pp. 603-605, Apr. 27, 1970.

Artru et al., "Practical theory of the multilayered transition radiation detector", Physical Review D, vol. 12, No. 5, pp. 1289-1306, Sep. 1, 1975.

*Primary Examiner*—Jack Berman
*Assistant Examiner*—Zia R. Hashmi
(74) *Attorney, Agent, or Firm*—Blakely, Sokoloff, Taylor & Zafman LLP (57) ABSTRACT

In one embodiment of the present invention, thermal deformation or bending of membranes in a transition radiation emitting structure can be reduced by providing flex regions in the membranes or the membrane support structures. In a second embodiment, deformation of membranes is compensated for by fabricating the membranes to cooperatively bend in a similar manner and direction. In a third embodiment, deformation of the membrane is reduced by fabricating the membranes with an intrinsic tensile or compressive stress.

26 Claims, 9 Drawing Sheets

TRANSITION RADIATION APPARATUS

RELATED APPLICATIONS

The present application is related to the subject matter of (1) U.S. patent application Ser. No. 10/371,541 of Goldstein, entitled "Extreme Ultraviolet Transition Oscillator," filed Feb. 21, 2003, and (2) the patent application of Shroff having attorney docket number P19917, entitled "Transition Radiation Apparatus and Method Therefor," filed Aug. 10, 2004. The present application, U.S. patent application Ser. No. 10/371,541, and the patent application of Shroff all share a common assignee.

FIELD OF THE INVENTION

Embodiments of the present invention relate generally to transition radiation. More specifically, embodiments of the present invention teach improved transition radiation emitting (TRE) structures.

BACKGROUND

Micro Electro Mechanical Systems (MEMS) processing is being investigated as an alternative for fabricating extreme ultraviolet (EUV) transition radiation laser (TRL) and transition radiation oscillator (TRO) structures. Using conventional MEMS deposition and etch processes, TRO (or TRL) structures can be fabricated by forming multilayered, spaced-apart membranes over a substrate. When the membranes are placed in the path of a mildly relativistic electron beam, a coherent superposition of transition radiation having a predetermined wavelength (for example, extreme ultraviolet (EUV) wavelengths around 13 nanometers), can be produced at the structure's output. Such structures can be used as EUV illumination sources in various applications, such as EUV lithography and EUV interferometry.

During operation of systems that use MEMS TRO and TRE structures, temperatures can exceed 1000 degrees Celsius. At these temperatures, membranes can deform relative to each other. Such deformation can destroy the periodicity of the multilayered membrane stack and impact the performance of the system that houses the structure.

Figure 1:
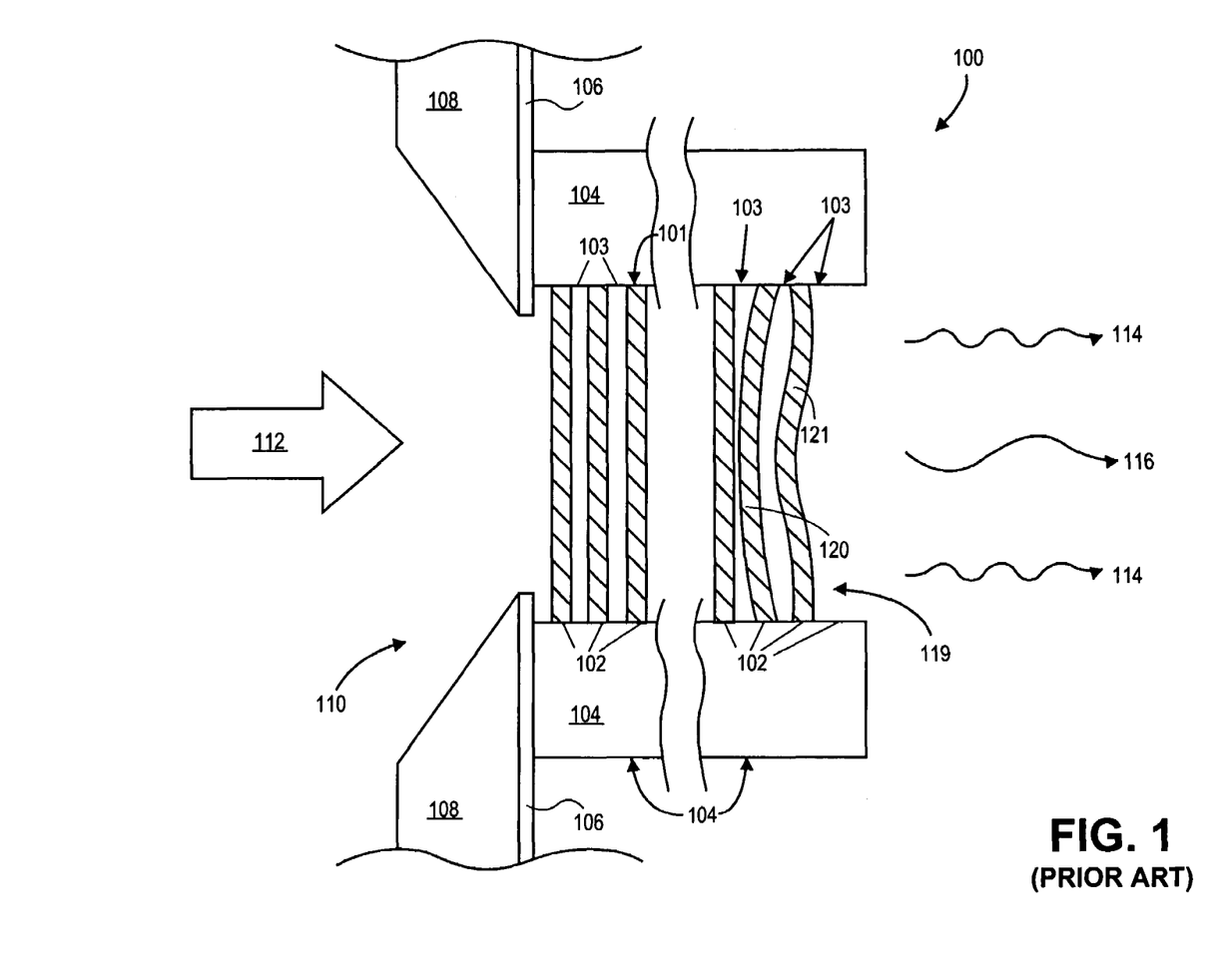
FIG. 1 illustrates an example of a prior art TRO structure having thermally induced membrane deformations.

Shown in FIG. 1 is a prior art TRO (or TRE) structure 100 having membranes 120 and 121 exhibiting deformation due to thermal stress. As shown in FIG. 1, edges 101 of membranes 102 are adjacent posts 104, and each membrane 102 is separated by a vacuum region 103. Posts 104 overlie an etch stop layer 106. And, etch stop layer 106 is formed over substrate 108. Substrate 108 has an electron beam port opening 110 through which an electron beam 112 is projected. When the electron beam crosses the interface between two mediums (i.e. the interface between the vacuum region 103 and membrane 102), forward directed radiation (e.g., transition radiation) is created and is emitted from output region 119.

Under normal operating conditions, the heat generated in TRO and TRE structures can cause membranes to deform (i.e. bend 120 or buckle 121). These membranes shape changes can impact the structure's performance by producing aberrational output radiation 116, which differs from the sought after output radiation 114. The effects of this aberrational output radiation 116 can include a shift in peak output intensity of the electron beam, degradation of the transmission of coherent light, or a shift in output wavelength.

DETAILED DESCRIPTION

Embodiments of the present invention relate generally to transition radiation emitting (TRE) structures (which include TRL structures, TRO structures, and the like). More specifically, embodiments of the present invention teach improved TRE structures that can accommodate high temperature operation and methods for forming them.

Figures 2A, 2B:
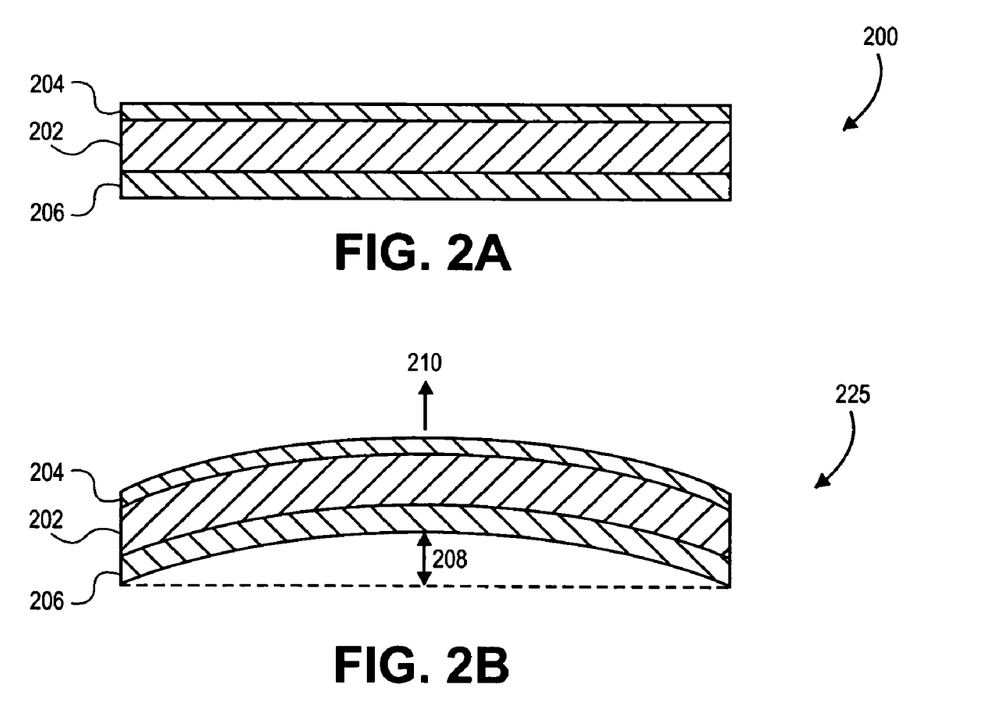
FIGS. 2A–2C illustrates an example of one embodiment of the present invention.

FIGS. 2A–2B illustrates an example of a TRE membrane fabricated in accordance with a first embodiment of the present invention. In this embodiment, the present inventors have recognized that to the extent membrane deformation is unavoidable, problems with such deformation may be addressed by constructing the membranes to preferentially deform or bend in the same direction in response to thermal (or physical) stress. In this way, deformation, while not overcome, may be accommodated and membrane spacing, periodicity, and the phase matching condition between membranes can be preserved.

Shown in FIG. 2A is membrane 200. In accordance with one embodiment, membrane 200 includes asymmetrical capping films 204 and 206 and membrane film 202. Capping film 204 is formed on one side of the membrane film 202 (here, the top side) and capping film 206 is formed on the opposite side of membrane film 202. Examples of materials that may be suitable for use as capping films 204 and 206 include but are not necessarily limited to titanium nitride (TiN) silicon carbide (SiC), carbon, (C), titanium nitride (TiN), tungsten (W), titanium tungsten (TiW), silicon-rich silicon nitride (SiN), stoichiometric silicon nitride (Si3N4), and the like.

Unlike prior art capping films, which are used only as oxidation barriers (i.e., they require thicknesses sufficient only to prevent oxidation of membrane film 202), this embodiment of the present invention uses capping films 204 and 206 that intentionally have different thicknesses on either side of the membrane film 202. The thicknesses of the capping films can vary, for example in a range of 2–7 nanometers (nm) depending on the choice of capping film material and underlying membrane film material. Molybdenum is currently one material being considered for use as membrane material in EUV applications. However, one of ordinary skill recognizes that other membrane materials can alternatively be used. Considerations when selecting the membrane and capping film materials should include the preferred output wavelength, integration of the materials, manufacturability and cost, among other things.

The thickness differential between the top and bottom capping films promotes the development of asymmetric stress in the film stack. As shown in FIG. 2B, the build-up of asymmetrical stress that results from the thickness differential between top capping film 204 and bottom capping film 206, can promote a bending or deformation 208 of membrane 225 in a specific direction 210. In addition to differences in thickness, the development of asymmetrical stress may also be achieved by forming the top film and the bottom film from different materials. In this case, the material differences can promote the bending or deformation 208 of membrane 225 in a specific direction 210.

Figure 2C:
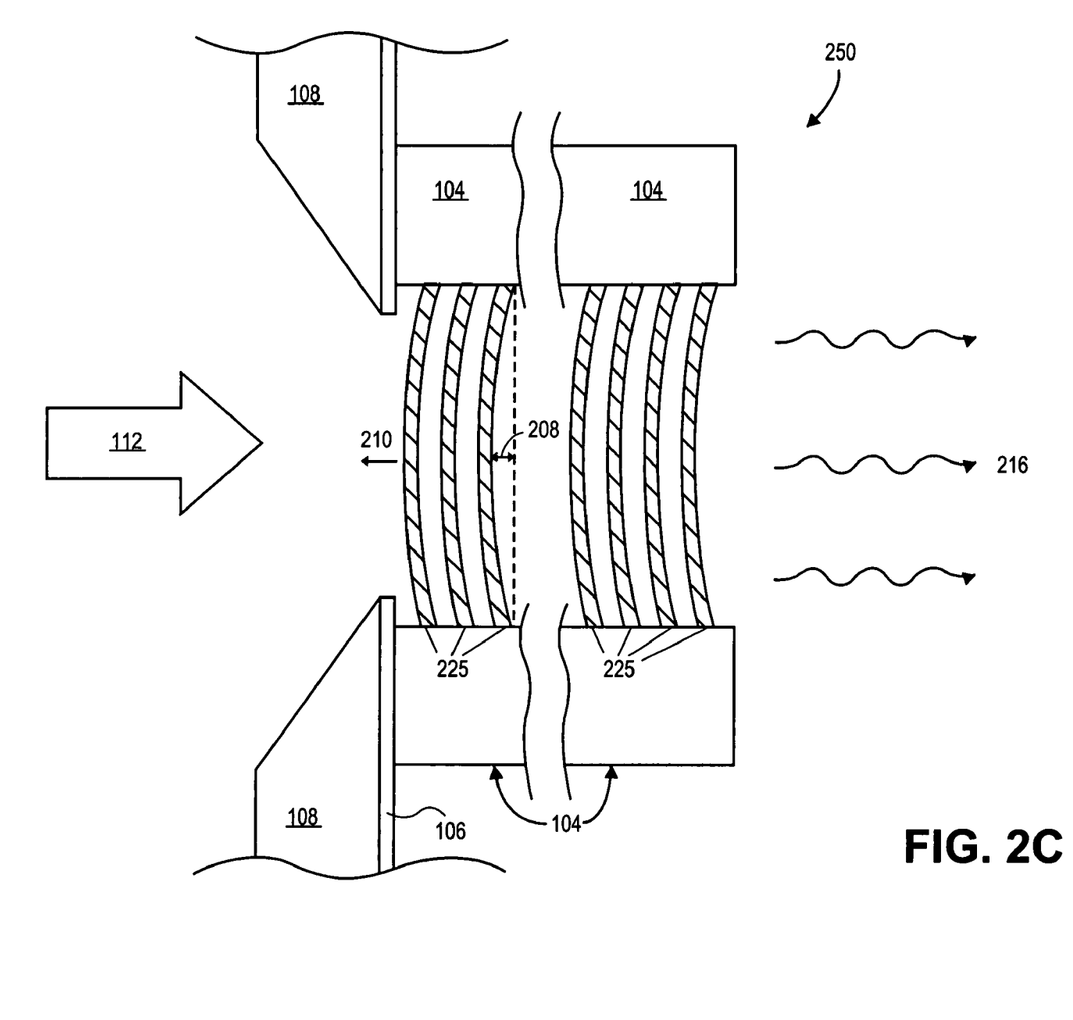

Turning now to FIG. 2C, a plurality of membranes 225, each having asymmetric capping films 204 and 206 and a membrane film 202 similar to those shown in FIGS. 2A and 2B (but not shown in FIG. 2C for the purpose of ease of illustration), have been incorporated into a TRE structure 250. As a result of operating the TRE structure 250, the temperature of the membranes 225 has increased to a point where thermal expansion of the membranes occurs. As shown in FIG. 2C, however, as a result of using asymmetrical capping films 204 and 206, the thermally induced stress promotes preferential deformation of membranes 225 only in the direction 210.

The high degree of control obtainable in MEMS processing with respect to composition and thickness of the films 202, 204, and 206 (shown in FIGS. 2A and 2B) and the intervening material layers between the membranes 225 (not shown), may permit manufacture of membranes 225 that are not only designed to preferentially bend in a specific direction, but also in terms of degree of deformation 208.

While the present embodiment discloses a tri-layered film structure to fabricate a membrane predisposed to deform or bend in a specific direction or a specific way, it is not intended to be limited as such. Any other combination of films that accomplish the effect of creating asymmetric stress (i.e. stress that promotes bending of the membrane in a specific direction or a specific way) in the membrane can be used. Moreover, additional films can also be incorporated into the film stack for other purposes. For example, in addition to using a film that promotes a specific type of deformation or bending, an additional buffer film could be used to limit the overall degree of deformation or bending. In other words, one film would be promoting a specific type of unidirectional deformation while the other film would limit the overall magnitude of the deformation.

Figure 3A:
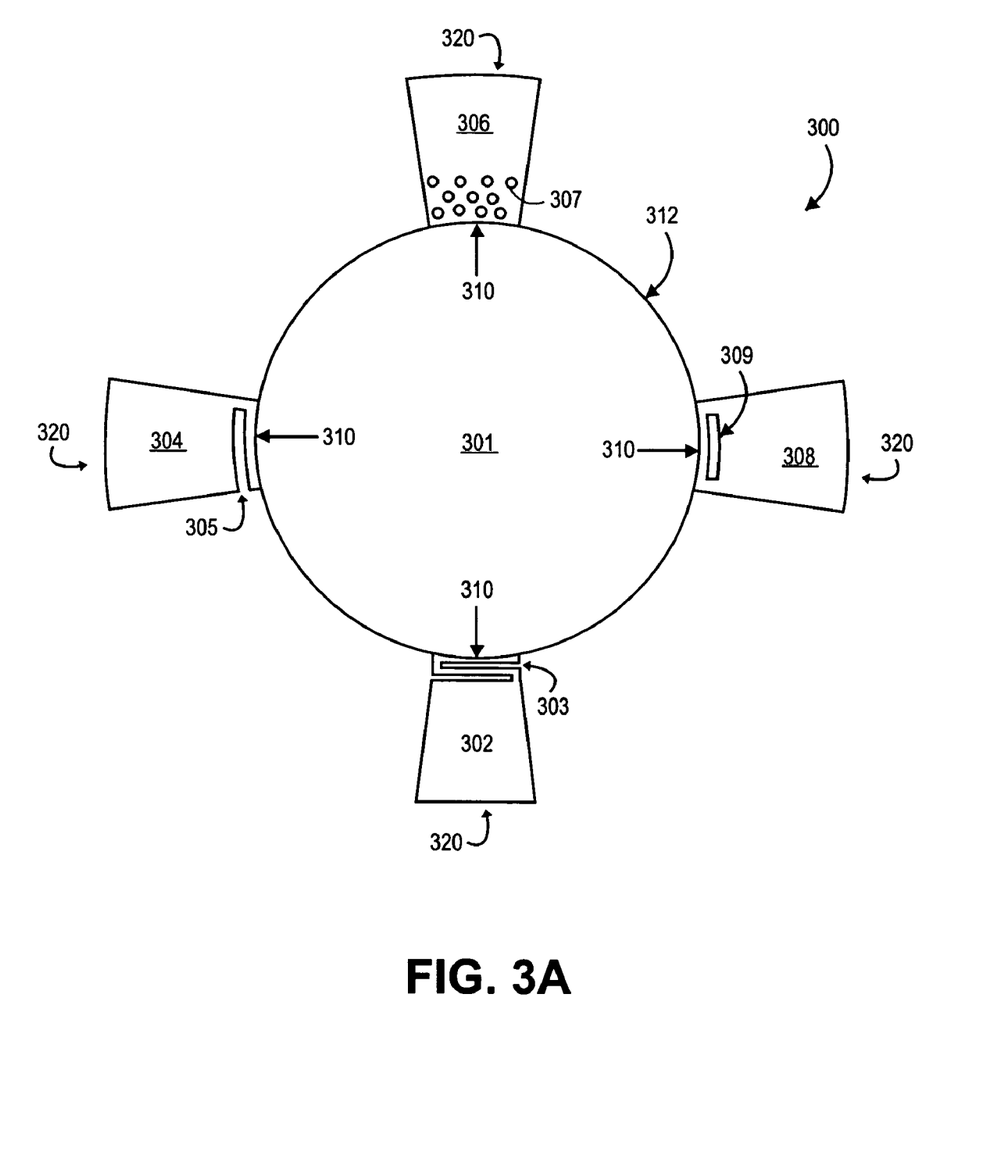
FIGS. 3A–3B illustrates an example of a second embodiment of the present invention.
Figure 3B:
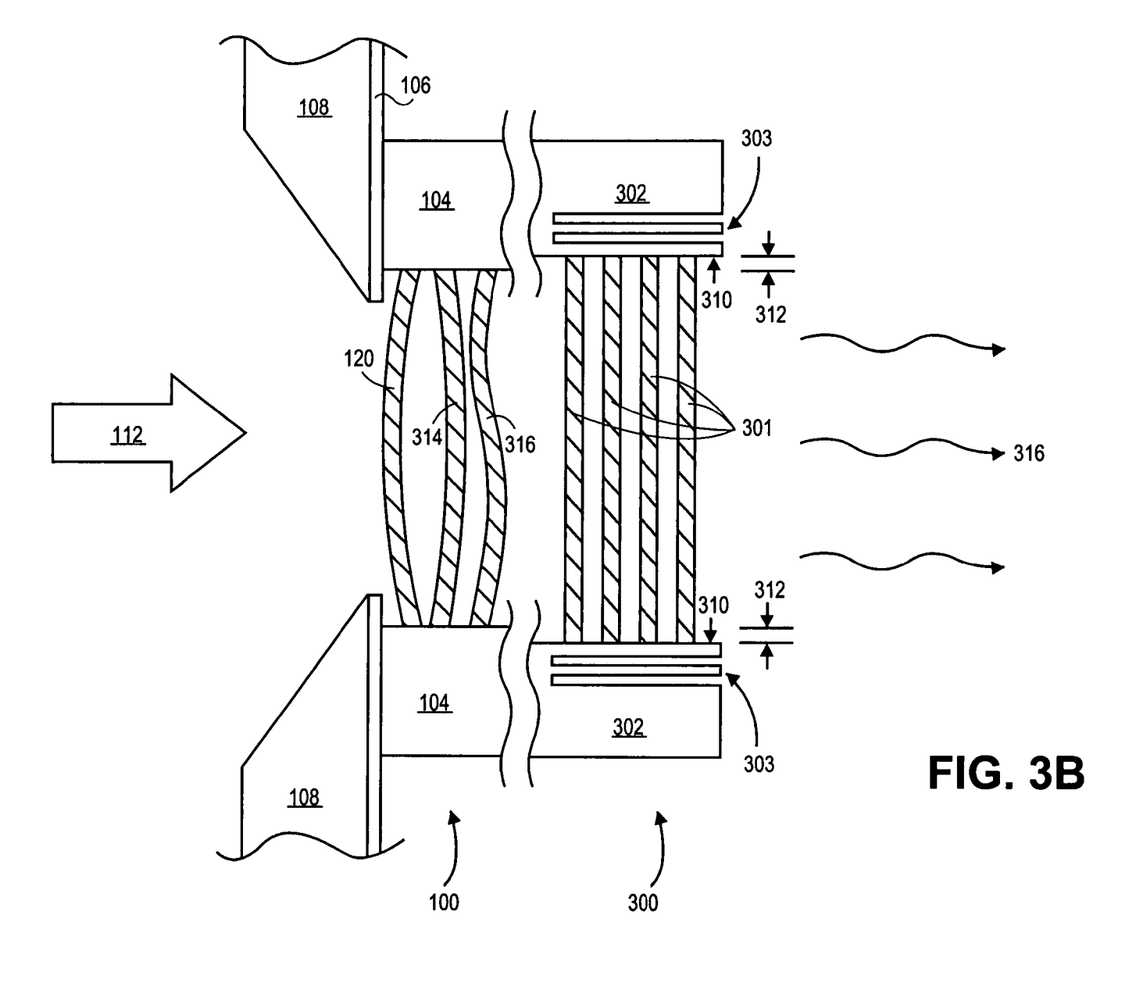

In FIGS. 3A–3B, a second embodiment of the present invention is disclosed. Here, membrane deformation and bending can be reduced by fabricating membrane support structures capable of accommodating thermal expansion of the membrane.

FIG. 3A illustrates a top-down view of a membrane 301 adjacent support structures 301. Alternative, non-limiting embodiments of the present invention are reflected by the differences in support structures 302, 304, 306, and 308. Each one of the support structures 302, 304, 306, and 308 can be used individually or in combination each other to accommodate thermal expansion of the membrane 301.

As indicated by the arrows 310 in FIG. 3A, during operation of a TRE device, the membrane 301 may thermally expand in response to the generation of heat. However, unlike the prior art support structures, which are typically rigid and inflexible, the support structures here accommodate thermal expansion of the membrane by absorbing it with flex regions 303, 305, 307, and 309 of membranes 302, 304, 306, and 308, respectively. The flex regions are spring-like features incorporated into the support structure which absorb membrane expansion by physically bending or flexing in response to it.

Feature 303 in support structure 302 is a serpentine-like feature. The serpentine portions of the support structure 302 can compress against themselves in response to the membrane's expansion. Feature 305 in support structure 304 is similar to feature 303 except fewer (in this case, only a single) compressible expansion regions have been formed in the support structure 304. Here, one side of the compressible expansion region 305 compresses (pinches) in response to the membrane's expansion. Features 307 in support structure 306 includes openings (or holes) that permit compression of the support structure. The shape of the openings can deform in response to the membrane's expansion. And, feature 309 in support structure 308 is a trench region bounded by portions of the support structure. The width of the trench can narrow in response to the expansion of the membrane 301.

The support structures 301 that include the spring-like features can be fabricated by forming support post openings in a stack of membrane and intervening sacrificial material layers, filling the support post openings with support post material, polishing away excess support post material, and then removing non-functional regions of the membrane and intervening sacrificial material layers.

In one embodiment, the support post openings can be patterned and etched to initially form the spring-like features as part of the opening. Then, the patterned openings can be filled with the support post material and excess support post material polished away to substantially define the support post structures. Finally, those portions of the membrane and intervening sacrificial material layers stack lying outside the perimeter 312 of the membrane 301 (including those portions defining the spring-like feature in the support structure) can then be removed to define a membrane adjacent the support post having the spring-like features.

In a second embodiment, after forming the support post openings (without any patterning to define the spring-like features), the openings are filled with a sacrificial material. The sacrificial material can then be patterned and etched to define the spring-like features. The openings containing the patterned sacrificial material can then be filled with support post material and then the excess support post material can be removed via polishing. Finally, portions of the stack of membrane and intervening sacrificial material layers lying outside the perimeter 312 of the membrane 301 and the sacrificial material in the opening are removed to define the membrane and support post having the spring-like features.

In yet a third embodiment, the support post structure can be formed in the support post openings via filling the openings with support post material and then polishing to remove the excess (without any patterning to define the spring-like features) followed by patterning and etching, laser ablation, focused ion milling, and the like, or combinations thereof to define the spring-like features directly in the support post structures.

In FIG. 3B, to illustrate the benefits of the present invent, a comparison is made between a portion of prior art TRE structure 100 and a portion of a TRE structure 300 that has incorporated an embodiment of the present invention. As shown in FIG. 3B, the prior art TRE structure 100 has membranes 120 and 314 which are bent and membrane 316 which is deformed. The bending and deformation are due to thermal expansion of the membranes that results from elevated temperatures experienced during operation of the TRE device. In the prior art structure 100, the support posts 104 are not adapted to accommodate expansion of the membranes and the deformation and bending are two possible membrane problems that can occur.

On the other hand, unlike the prior art TRE structure 100, the supports posts 302 (i.e., the serpentine support structure 302 shown in FIG. 3A, for example) of the TRE structure 300 are adapted to accommodate expansion of the membranes. As shown in FIG. 3B, thermal expansion 310 of the membranes 301 is absorbed by the flex region 303. The amount of expansion absorbed is indicated by a distance 312, which represents a displacement that flex region 303 in TRE structure 300 accommodates as compared to the prior art structure 100. Thus, using embodiments of FIG. 3 or any obvious variants thereof, membrane deformation is reduced by building a TRE structure that will accommodate thermal expansion of the membranes and reduce problems associated with the deformation and bending of membranes. In this way, thermal expansion, while not overcome, can be accommodated by using adjacent structures.

Figure 3C:
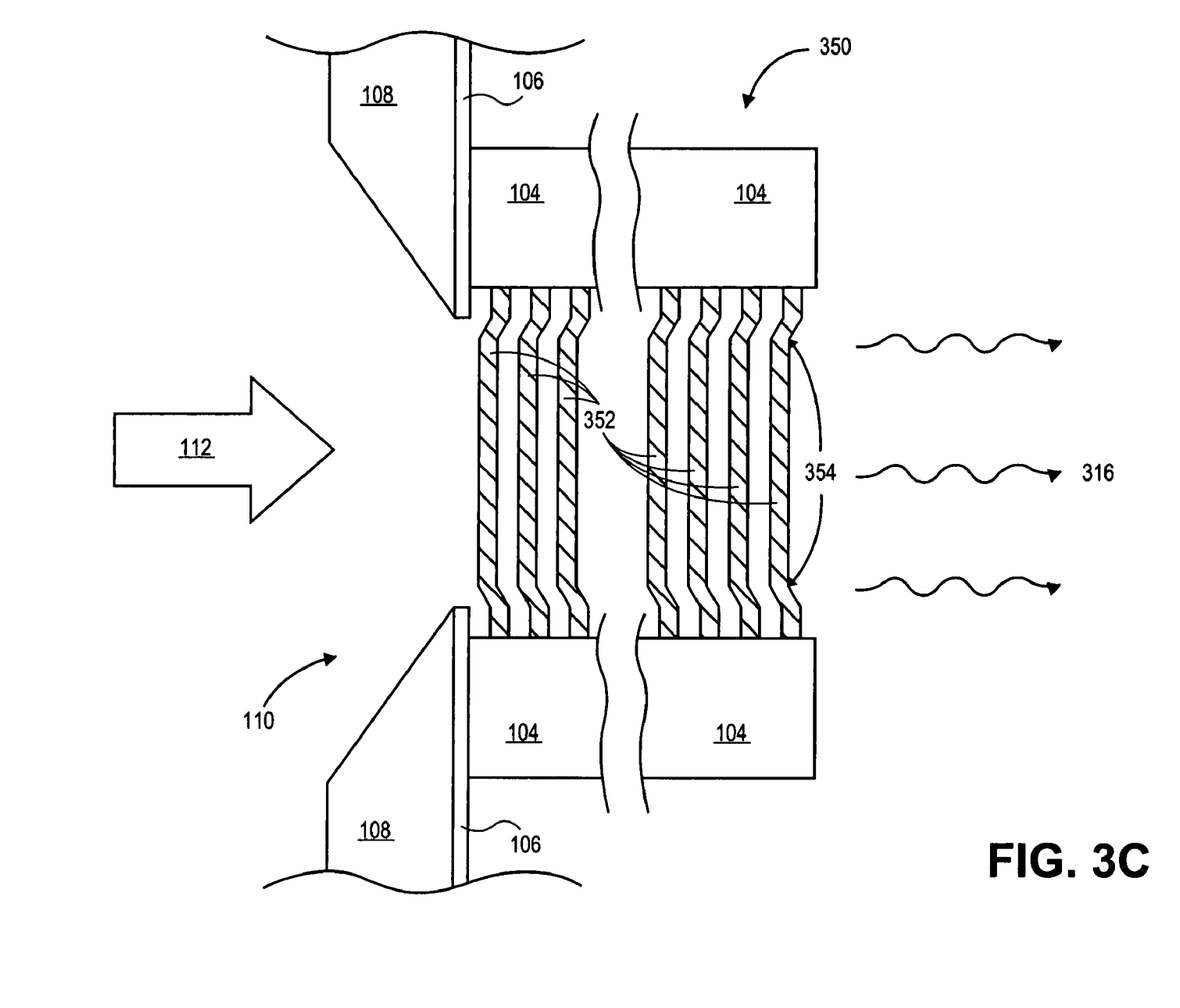

While the embodiment of FIG. 3A discloses flex regions associated with the support posts, one of ordinary skill recognizes that such flex regions can alternatively be incorporated into the membrane regions. For example, shown in FIG. 3C is an alternative embodiment showing operation of a TRE structure 350 under conditions wherein thermal expansion of the membranes might otherwise produce bending and deformation. However, in FIG. 3C, the membranes 352 have flex regions 354 incorporated into the membrane itself. This can be accomplished by forming grooves at specified locations (i.e. at or near the flex regions) in the membrane, or by thinning portions of the membrane toward the perimeter, or by any other number of methods. The flex regions 354, accommodates the thermal expansion of the membrane by confining distortion of the membrane to specific areas of the membrane. Unlike the embodiment disclosed in FIGS. 2A–2C which preferentially bends the membrane in a certain direction and to a certain degree, the present embodiment shown in FIG. 3C limits bending to specific localized areas of the membrane, thereby maintaining overall planarity and relative spacing between membranes. One of ordinary skill recognizes that any other number or type of flex regions or even hinged regions can be incorporated into the TRE structure to accomplish the objective of accommodating the membrane's thermal expansion.

Figure 4A:
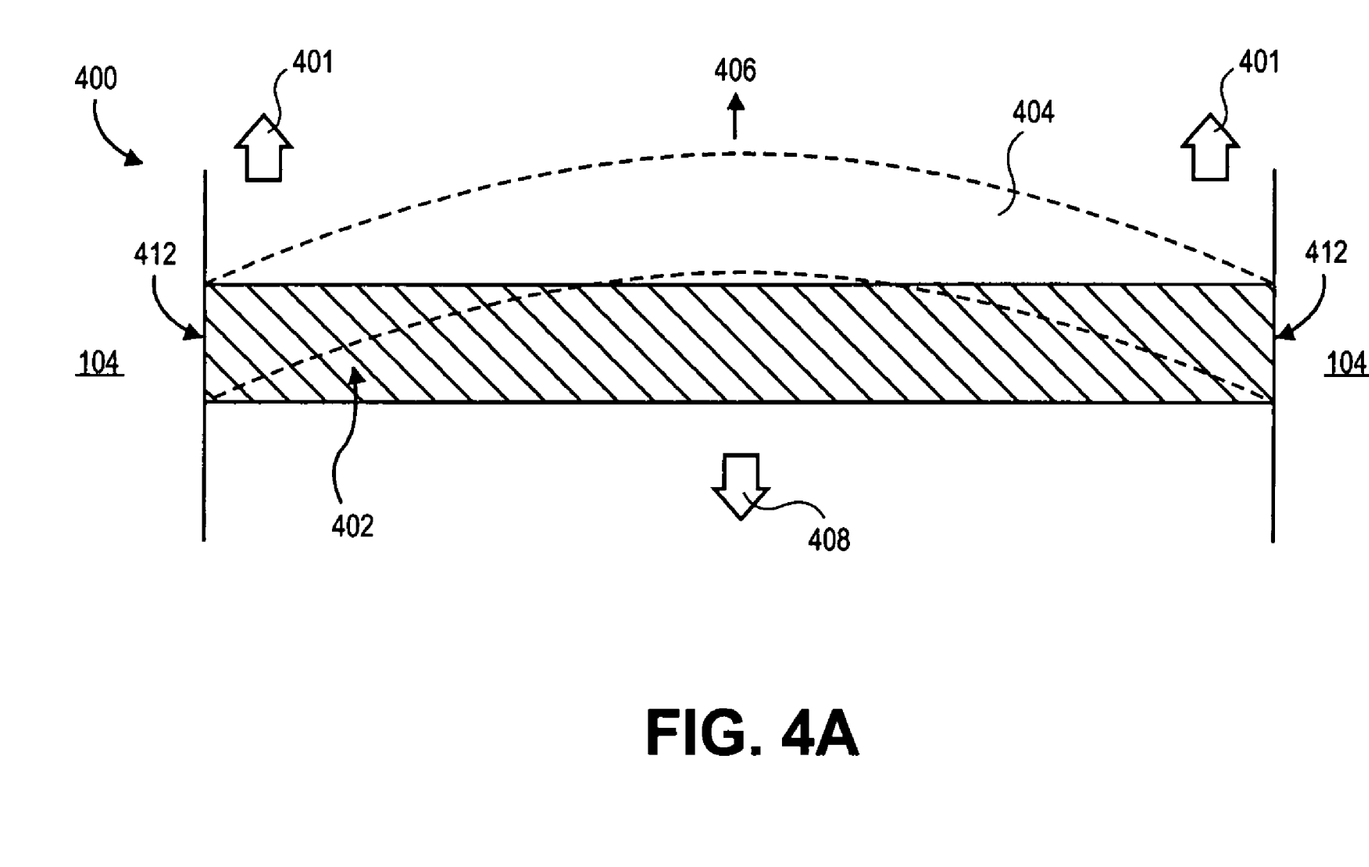
FIGS. 4A–4B illustrates an example of a third embodiment of the present invention.
Figure 4B:
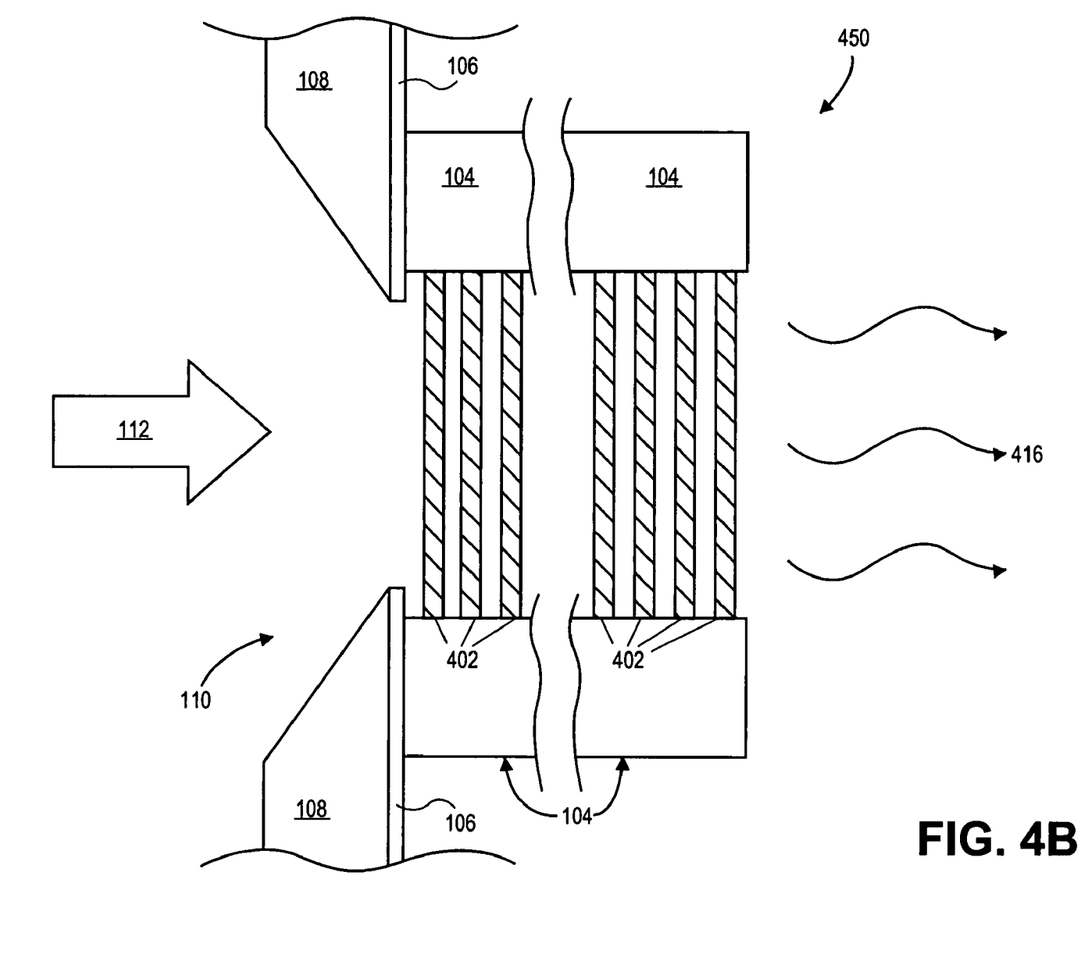

FIGS. 4A–4B, illustrate a third embodiment of the present invention, wherein membrane deformation or bending can be reduced by depositing the membrane with an intrinsic tensile stress that will counteract the effects of membrane thermal expansion. As shown in FIG. 4A, The membrane 402, above a certain temperature, may have a tendency to bend, as is indicated by the dashed outline 404. However, the present inventors have recognized that problems with bending may be overcome by depositing the membrane such that the film exhibits an initial intrinsic tensile stress (or alternatively compressive stress, depending on the type of bending of the membrane).

Under conditions of intrinsic tensile stress, the edge regions 412 of the membrane 402 will be predisposed to peel up as indicated by the arrows 401 and the central portion of the membrane 402 will be predisposed to deflect downward as indicated by the arrow 408. This intrinsic stress may counteract the effects of the membrane thermal expansion such that the bending of the membrane 402 in the direction 406 is reduced or eliminated.

Turning now to FIG. 4B, a plurality of membranes 402, deposited having an initial intrinsic tensile stress similar to the membrane 402 shown in FIG. 4A, have been incorporated into a TRE structure 450. As a result of operating the TRE structure, the temperature of the membranes 225 has increased to a point where thermal expansion of the membranes 225 would otherwise occur. As shown in FIG. 4B, however, the intrinsic tensile stress in membranes 402 counteracts the tendency of the membrane to bend or deform. Thus, the output radiation 416 is relatively unaffected by the system's operating temperature.

Figure 5:
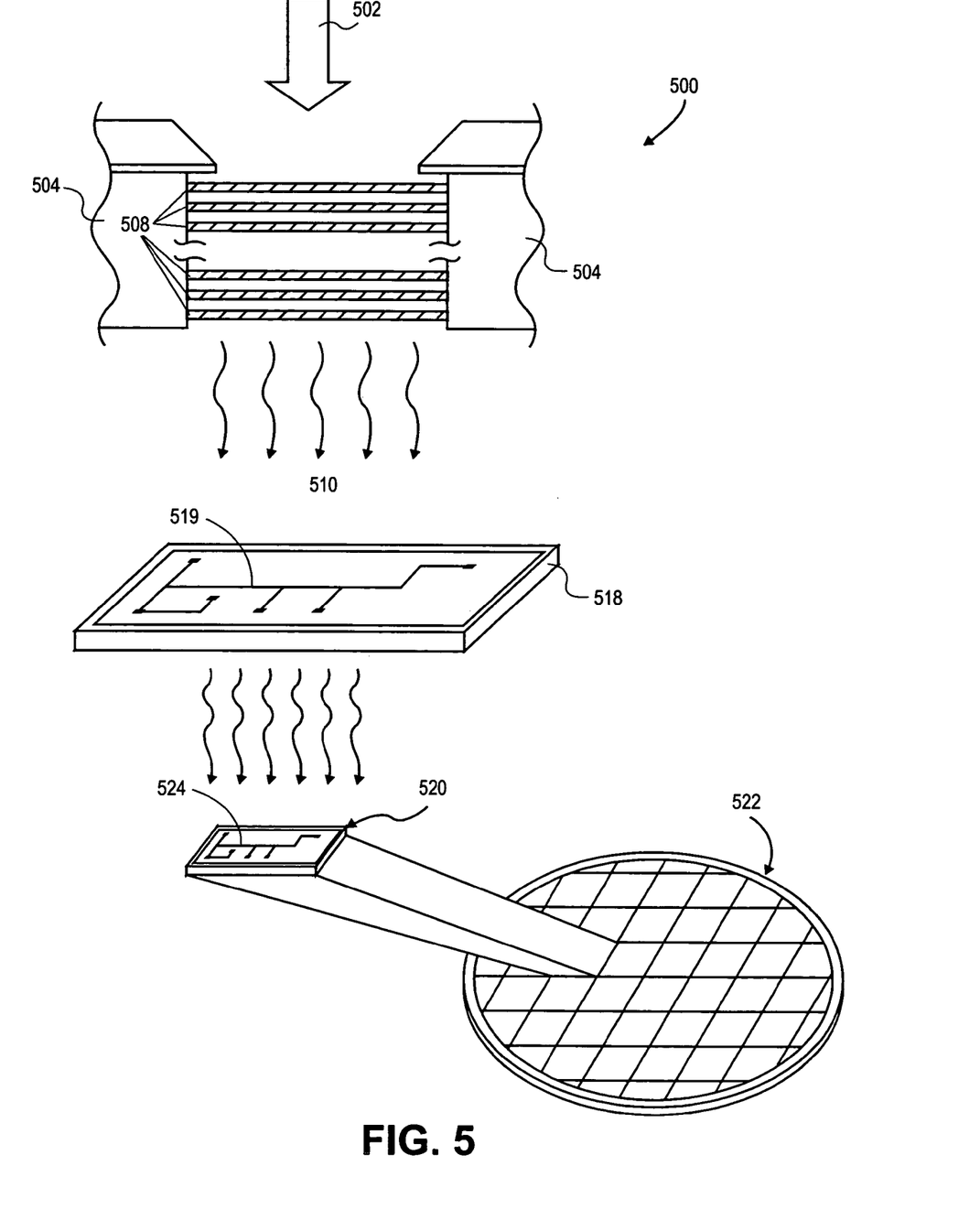
FIG. 5 illustrates use of a TRE structure that incorporates one or more embodiments of the present invention to fabricate a semiconductor structure.

Turning now to FIG. 5, a TRE structure 500, incorporating one or more of the embodiments discussed previously with respect to FIGS. 2–4 is used to manufacture a semiconductor device 520 on a semiconductor substrate 522. As shown in FIG. 5, semiconductor substrate 522 is placed in proximity to a TRE structure 500. An electron beam 502 is projected through the TRE structure 500, and more specifically through membranes 508 adjacent support posts 504 fabricated using one or more of the embodiments disclosed herein, to produce an output radiation 510 in the EUV wavelength region (around 13 nm).

As shown in FIG. 5, the output radiation 510 can be used as a source of illumination for EUV lithography, wherein the EUV radiation is projected through a lithography mask 518 containing a mask image 519 (For ease of explanation and illustration, other EUV projection components, such as the source collector system, the illuminator optical system, the projection optics, and the like have not been included in FIG. 5. However, one of ordinary skill recognizes that they exist and may be required for optimal TRE projection system operation). The mask image 519 is thereby transferred onto a semiconductor substrate 522 covered with resist. The substrate is subsequently developed and etched to produce a semiconductor structure 524 on a semiconductor die 520 corresponding to the mask image 519.

While the use of embodiments of the present invention have been described with respect to illumination for EUV lithography, one of ordinary skill recognizes that embodiments of the present invention may also be used for other TRE applications, such as EUV microscopy, EUV interferometric lithography, and EUV interferometry. Also, for the purposes of this specification, the term TRE structure includes the previously mentioned TRL and TRO structures, although the term TRE is not intended to be limited by the formation or use of such TRL or TRO structures. In addition, embodiments of the present invention are not necessarily limited to the use or formation of TRE structures for only EUV applications. That is, embodiments of the present invention are also applicable for fabricating TRE structures that produce illumination at wavelengths both above and below the EUV region.

The various implementations described above have been presented by way of example only, and not limitation. Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A transition radiation emitting structure comprising a first membrane and a membrane support structure, wherein at least one of the first membrane and the membrane support structure accommodates process induced stress of at least the membrane.

2. The transition radiation emitting structure of claim 1, wherein the first membrane is a subset of a plurality of membranes, and wherein the plurality of membranes is configured to produce output radiation at extreme ultraviolet wavelengths.

3. The transition radiation emitting structure of claim 1, wherein the process induced stress results from thermal expansion of the first membrane.

4. The transition radiation emitting structure of claim 3, wherein the membrane support structure includes a flex region.

5. The transition radiation emitting structure of claim 3, wherein the first membrane includes a flex region.

6. The transition radiation emitting structure of claim 3, wherein an intrinsic stress of the first membrane counteracts a thermal expansion effect of the first membrane.

7. The transition radiation emitting structure of claim 6, wherein the intrinsic stress is further characterized as a tensile stress.

8. The transition radiation emitting structure of claim 3, wherein the first membrane distorts in a predetermined manner.

9. The transition radiation emitting structure of claim 8, wherein distorts in a predetermined manner is further characterized as bends in a specific direction.

10. The transition radiation emitting structure of claim 9 further comprising a second membrane, wherein the second membrane cooperatively bends in a same specific direction as the first membrane.

11. The transition radiation emitting structure of claim 8, wherein the membrane further comprises a membrane film, an upper capping film, and lower capping film, wherein the upper capping film is different from the lower capping film.

12. The transition radiation emitting structure of claim 11, wherein the upper capping film is different from the lower capping film by a characteristic selected from the group consisting of film composition and film thickness.

13. A method for manufacturing a semiconductor structure comprising:
    positioning a semiconductor substrate in proximity to a transition radiation emitting structure, the transition radiation emitting structure having membranes and support structures, wherein at least one of a first membrane and a first membrane support structure accommodates process induced stress of at least the membrane;
    passing electron beam energy through the membranes to generate radiation; and
    using the radiation to define patterned features on the semiconductor substrate.

14. The method of claim 13, wherein the membranes are configured to produce output radiation at extreme ultraviolet wavelengths.

15. The method of claim 13, wherein the process induced stress results from thermal expansion of the first membrane.

16. The method of claim 15, wherein at least the first membrane support structure includes a flex region.

17. The method of claim 15, wherein at least the first membrane includes a flex region.

18. The method of claim 15, wherein an intrinsic stress of the first membrane counteracts a thermal expansion effect of the first membrane.

19. The method of claim 18, wherein the intrinsic stress is further characterized as a tensile stress.

20. The method of claim 15, wherein the first membrane distorts in a predetermined manner in response to the thermal expansion.

21. The method of claim 20, wherein distorts in a predetermined manner is further characterized as bends in a specific direction.

22. The method of claim 21 further comprising a second membrane, wherein the second membrane cooperatively bends in a same specific direction as the first membrane.

23. The method of claim 20, wherein the membrane further comprises a membrane film, an upper capping film, and a lower capping film, wherein the upper capping film is different from the lower capping film.

24. The method of claim 23, wherein the upper capping film is different from the lower capping film by a physical characteristic selected from the group consisting of film composition and film thickness.

25. A transition radiation emitting structure comprising a plurality of membranes, wherein at least a first membrane responds to thermally induced stress by one of resisting membrane shape changes that affect a position of the first membrane relative to a second membrane and promoting membrane shape changes that substantially maintain a position of the first membrane relative to the second membrane.

26. The transition radiation emitting structure of claim 25, wherein the transition radiation emitting structure produces output radiation at extreme ultraviolet wavelengths.

* * * * *